(12) United States Patent
Shearman et al.

(10) Patent No.: US 6,545,850 B1
(45) Date of Patent: Apr. 8, 2003

(54) BACKPLANE POWER LANDING SYSTEM

(75) Inventors: Simon E. Shearman, Almonte (CA); Geoffrey G. Skanes, Richmond (CA); Kalvin W. Korpela, Ottawa (CA); Douglas B. Cross, Ottawa (CA); Luc Boucher, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/644,648

(22) Filed: Aug. 24, 2000

(51) Int. Cl.[7] ................................................. H02H 1/00
(52) U.S. Cl. ........................ 361/113; 361/118; 361/119
(58) Field of Search ............................... 361/113, 118, 361/119, 127

(56) References Cited

U.S. PATENT DOCUMENTS 5,680,294 A * 10/1997 Stora et al. ................ 361/695
5,841,074 A    11/1998 Egan et al. ................. 615/154

* cited by examiner

Primary Examiner—Stephen W. Jackson (57) ABSTRACT

A backplane power landing system having a backplane to which is attached extruded metal mounts on which are mounted compact power filter modules. The mounts are adapted to be conductively sealed, for the purpose of electromagnetic compatibility, to the backplane and have guidance slots to facilitate aligning the power filter modules which extend through openings in the central beam of the mount, to make contact with the backplane. The power filter modules are fastened to the mounts in a manner which maintains a conductive seal so as to deliver inputted power to the backplane filtered of radiated and conducted emission noise.

38 Claims, 8 Drawing Sheets

BACKPLANE POWER LANDING SYSTEM

FIELD OF THE INVENTION

The present invention relates to a system for landing power on a backplane.

BACKGROUND OF THE INVENTION

A backplane typically comprises a plurality of conductive layers held rigidly in spaced parallel relation by an interleaved plurality of dielectric layers. While a given dielectric layer has equal significance with respect to the two conductive layers flanking it, one sometimes finds it convenient to conceptualize the backplane as comprising a plurality of coextensive circuit board layers laminated to one another, each layer being of composite construction, including a conductive layer and a dielectric layer. The backplane carries a plurality of parallel multiterminal sockets that receive circuit packs on which the computer system components are constructed. Some of the backplane conductive layers are used for signal propagation, and comprise a relatively large number of separate conductive traces running between the parallel transverse sockets. Others of the conductive layers are so called power planes that provide the fixed voltage levels necessary for system operation, and are generally in the form of solid sheets of conductive material, typically copper.

Each socket includes a large plurality of pins known as load pins that pass through small plated holes bored through all the layers and make electrical contact with a desired one of the backplane conductive layers. Where connection to a given layer is not required, a region surrounding the hole through that particular conductive layer is insulated to prevent the pin from making contact. The plated holes are sized relative to the connector pins for a press fit.

When supplying power to backplanes one common method consists of power supply connections known as source pins that are made in a similar manner to the aforementioned load pins, but on a larger scale. It will be appreciated that current is supplied to or drawn from the power plane over a relatively small area, leading to relatively large local current densities and an unequal distribution of current over the entirety of the power planes. It will also be appreciated that due to design constrains the source pins are not always centered between the load pins, leading to unequal distribution of current over the power planes and unequal current sharing among the load pins. This power distribution system tends to be unsuitable for larger currents because load pins having a shorter linear distance to the source pins will have a lower resistance with respect to the source pins and thus will source more current than load pins further from the source pins. To avoid exceeding the current rating of the load pins closest to the power source, smaller power levels are required. This results in inefficient use of the current sourcing capacity of the distant load pins.

Power units also require guidance and backplane power connectors have traditionally been guided with alignment pins fastened to the backplane. As well, power units need to be firmly attached to the backplane requiring many mounting fasteners screwed to the backplane. The totality of these connectors consumes valuable backplate real estate, limiting the space available for power tracks of appropriate width.

An attempt to equally distribute current has been made using a stepped backplane configuration. In a stepped backplane, the conductive and dielectric layers are laminated while having the same transverse extent. An edge of the backplane is then milled to expose the conductive layers in a stepped fashion. Rectangular bus bars are then mounted to the exposed conductive layers to provide a parallel power distribution. The stepped backplane however fails to provide equal current over the length of the power planes and thus fails to provide equal current to each load pin. Moreover, stepped backplanes are costly as they require post lamination milling.

In the aforementioned methods separate A and B power units are required for the sockets they supply because, if one power unit were to service many different sockets, all those sockets would lose power if the power unit were to go out of service. It is preferable to use board real estate for signal connections rather than redundant sources of power. What is needed is a method of supplying power to sockets on a one to one power unit to socket ratio.

For the foregoing reasons, there exists in the industry a need for an improved system of landing power on a backplane that provides for a reduction in the amount of required backplane connections.

SUMMARY OF THE INVENTION

The present invention is directed to a backplane landing system that satisfies this need. The system is comprised of a backplane connected with at least one power input mount comprising a of conductive material that is conductively sealed to the backplane for the purpose of electromagnetic compatibility. The power input mount has compact power input modules mounted in a manner so as to be conductively sealed to the power input mount.

In a more limited aspect of the invention the power input mount is formed from extruded metal with the power input modules guided into position using slots in the power input mount that mate with protrusions in the housing of the power input module. The power input modules are fastened to holes in the power input mount with elastomeric gaskets providing a conductive seal.

In a preferred aspect of the invention the power input mount is substantially H shaped and edge-connected to the backplane.

In a preferred aspect of the invention the power input module comprises a means for filtering the power of radiated and conducted emission noise.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

Figure 1:
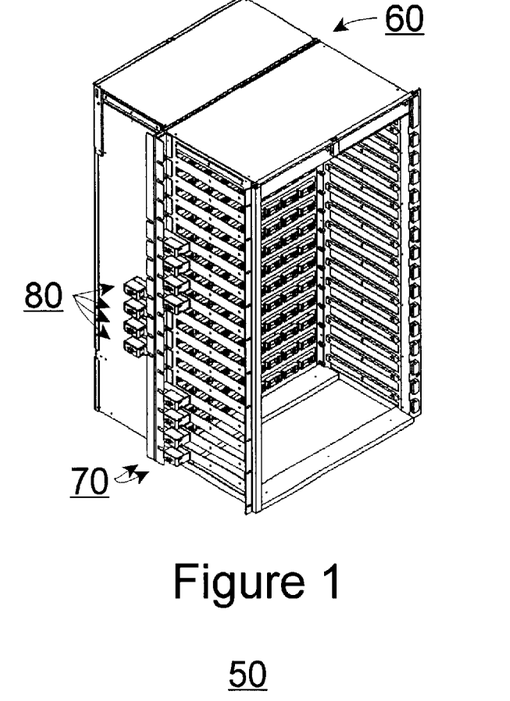
FIG. 1 is a perspective view of the backplane power landing system showing the backplane, power input mounts, and power filter modules in assembled form.

As shown in FIG. 1, the backplane power landing system 50 comprises a backplane 60 and at least one power input mount 70 comprised of a rail of conductive material connected to an edge of the backplane 60 so as to be conductively sealed for the purpose of electromagnetic compatibility (EMC). The power input mount 70 is attached with compact power filter modules 80 in a manner that provides for a conductively sealed contact between the power filter module 80 and the power input mount 70 whereby power flows between the power filter module 80 and the backplane 60.

Figure 2:
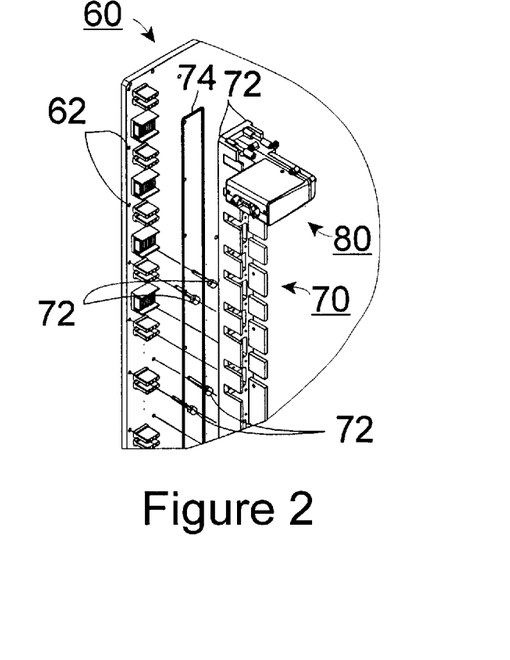
FIG. 2 is an assembly perspective view of the backplane and power input mount with an attached power filter module showing the fasteners in alignment with the fastening holes and an elastomeric gasket.

As shown in FIG. 2, an elastomeric gasket 74 is extruded onto the backplane side of the power input mount 70, seated in a recess that is adapted to permit the elastomeric gasket 74 to protrude beyond the surface of the power input mount 70. The backplane 60 is connected with the power input mount 70 using fasteners 72 on the power input mount 70 that mate with corresponding holes 62 in the backplane 60 so that when the elastomeric gasket 74 is sandwiched between the backplane surface of the power input mount 70 and the backplane 60 a press fit is provided, producing a conductive seal.

Figure 3:
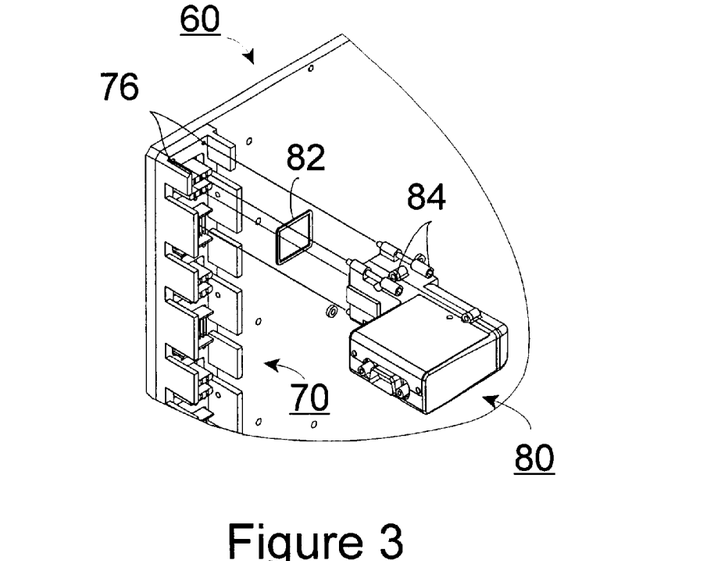
FIG. 3 is an assembly perspective view of the backplane having affixed the mount and the power filter module mounted with an elastomeric gasket.

As shown in FIG. 3, an elastomeric gasket 82 is extruded onto the backplane end of an aluminum housing 90 of the power filter module 80, seated in a recess that is adapted to permit the elastomeric gasket 82 to protrude beyond the backplane end surface of the power filter module housing 90. The power filter module 80 is mounted to the power input mount 70 using fasteners 84 on the power filter module 80 that mate with corresponding holes 76 in the power input mount 70 so that when the elastomeric gasket 82 is sandwiched between the backplane end of the power filter module housing 90 and the power input mount 70 a press fit is provided, producing a conductive seal.

Figure 4:
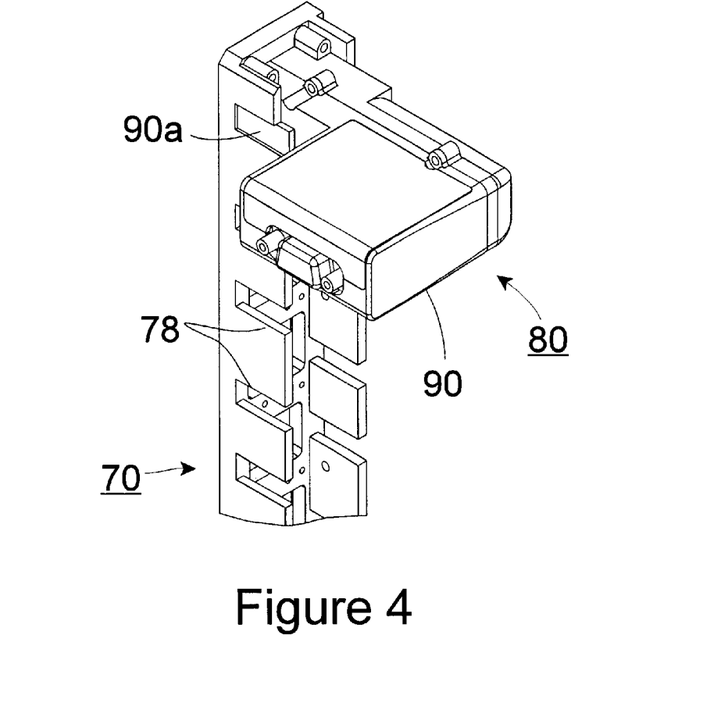
FIG. 4 is a perspective view of the alignment features on the power filter module and the power input rail.
Figure 5:
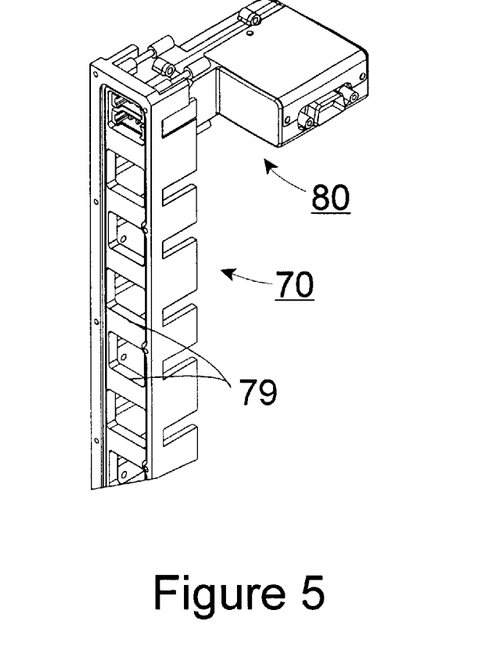
FIG. 5 is a perspective view of the power filter module protruding through an opening in the power input mount.

As shown in FIG. 4, the power filter module 80 is guided into the correct location on the power input mount 70 that also corresponds with the power filter module's 80 required location on the backplane 60. Proper guidance is achieved by using alignment slots 78 that are cut from the side arms of the extruded metal rail of the power input mount 70, the slots 78 being adapted to receive corresponding alignment protrusions 90a on the sides oft he of the power filter module housing 90. As shown in FIG. 5, daughter board connectors 86 protruding through the housing 90 at the backplane end of the power filter module 80 also protrude, when mounted, through an opening 79 cut from the central beam of the power input mount 70 permitting the backplane end of the power filter module 80 to mate with the backplate 60.

Figure 6:
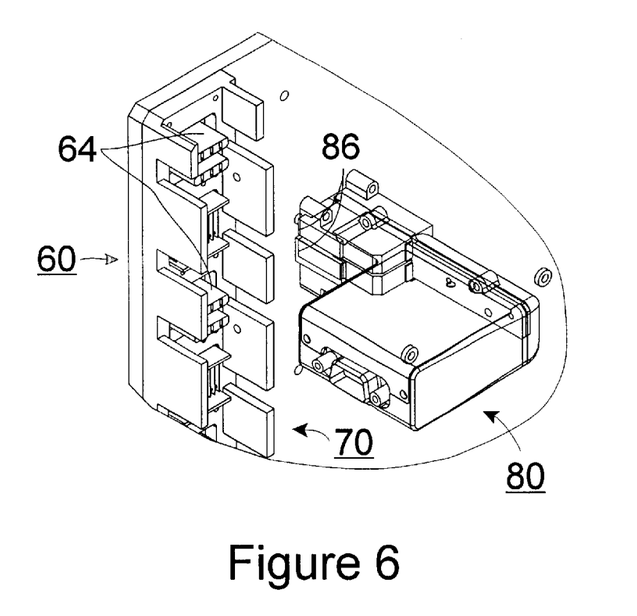
FIG. 6 is an assembly perspective view of the daughter board connectors and the backplane connectors.

As shown in FIG. 6, the backplane end of the power filter module 80 is fitted with "female" daughter board connectors 86 which mate with corresponding "male" backplane connectors 64, the backplane connectors 64 being affixed to the backplane 60.

Figure 7:
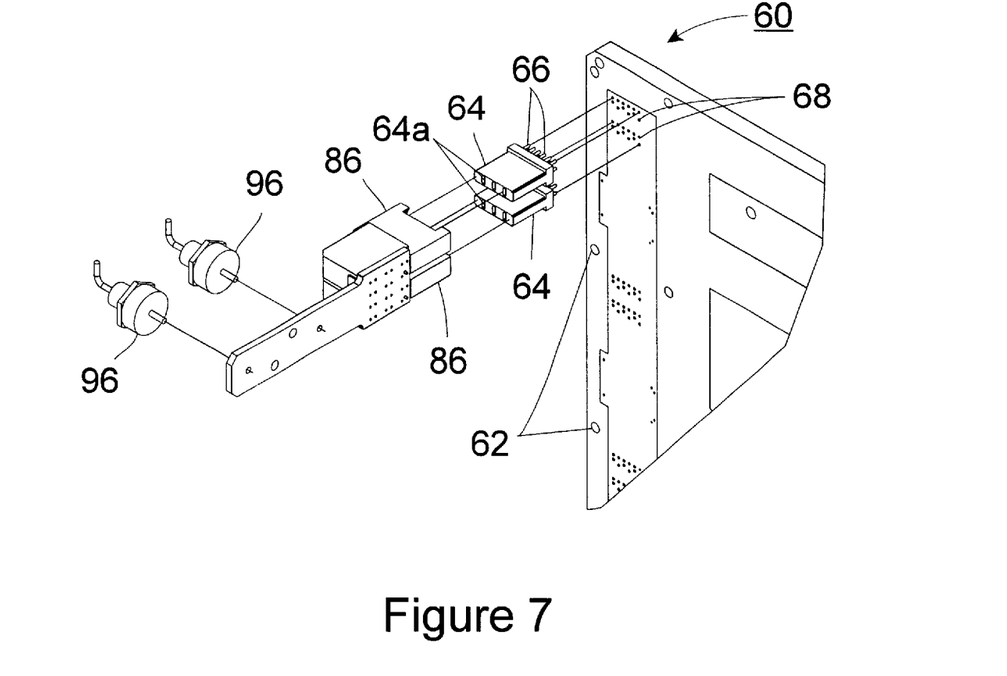
FIG. 7 is an assembly perspective view of the backplane connector, backplane, daughter board connectors, copper pins, and pin holes.

As shown in FIG. 7, the backplane connectors 64 are comprised of copper blades 64a that are electrically connected to sets of copper pins 66. The copper pins 66 are inserted in a press fit manner into copper-lined pin holes 68 that run transversely through the interleaved layers of the backplane 60. The copper-lined pin holes 68 are adapted to come into electrical contact with the copper power corridors that are interleaved with dielectric layers within the backplane 60, thereby enabling power to flow between the power filter module 80 and the backplane 60. In one embodiment, for selected copper power corridor layers within the backplane 60, the immediate area of the copper power corridors around the copper-lined pin holes 68 can be insulated to prevent the flow of power to those selected power corridors.

Figure 8:
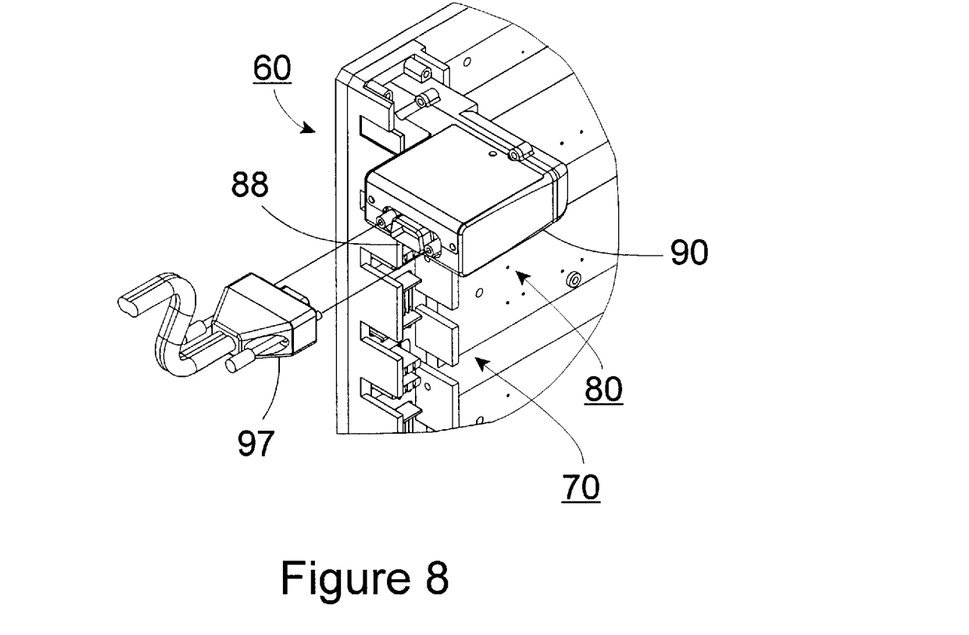
FIG. 8 is a perspective view of the D-Subminiature connector integrated into the housing and showing how the power cable would be connected.
Figure 9:
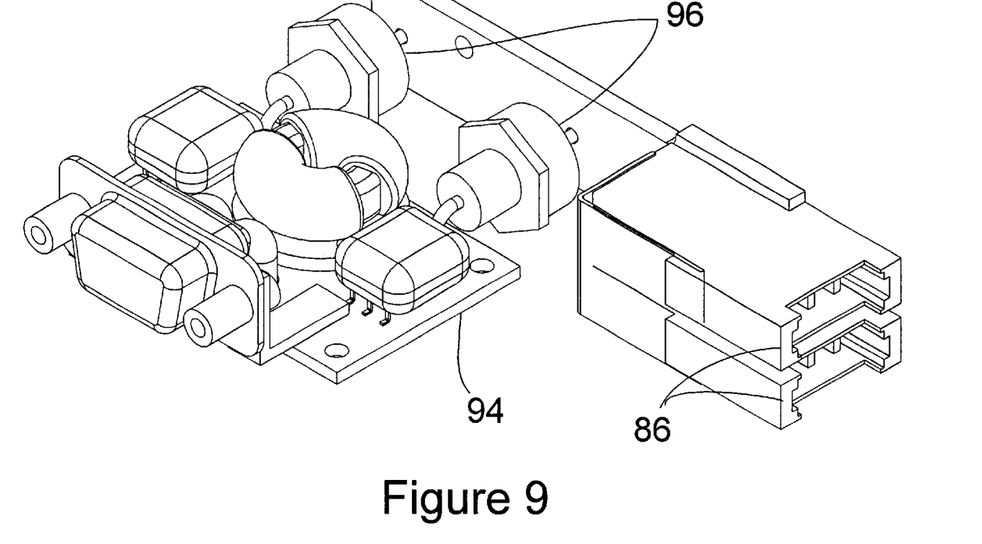
FIG. 9 is a perspective view of the D-Subminiature connector, the two high-current pins, the printed circuit board in assembled form, as well as the optional printed circuit board filter.
Figure 10:
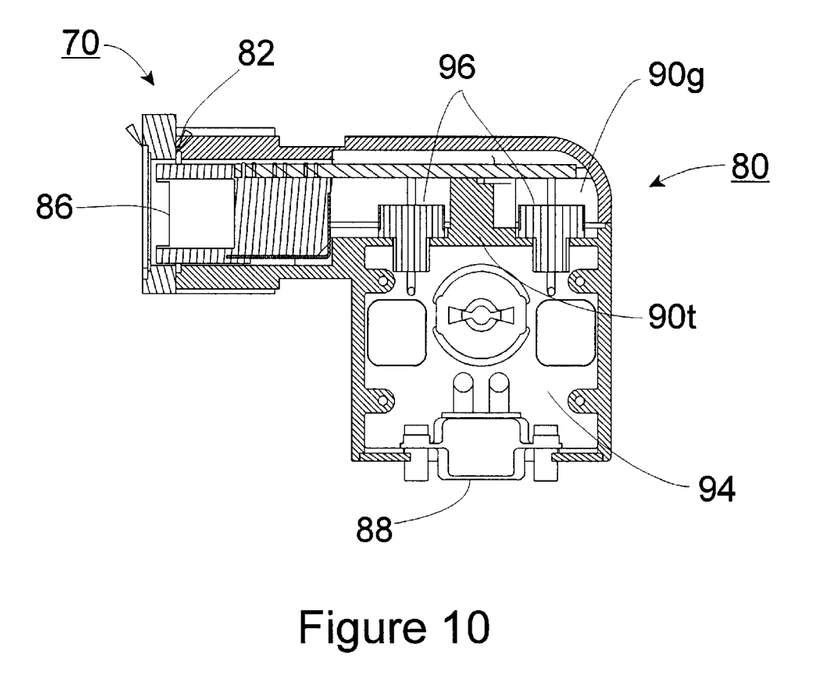
FIG. 10 is a perspective view of the two high-current pins, the feed-thru capacitors terminated in the printed circuit board and the daughter board connectors.

As shown in FIG. 8, the power filter module 80 comprises a D-Subminiature (D-Sub) power connector 88 integrated into the power source end of the aluminum housing 90 so as to received unfiltered power delivered by a power cable 97 having attached a corresponding D-Sub power connector. As shown in FIG. 9, inside the shroud of the aluminum housing 90 two high current pins 92 on the D-Sub power connector 88 are electrically connected to at least one printed circuit board 94. As shown in FIG. 10, two feed-thru capacitors 96 are terminated by being soldered to the printed circuit board 94, the feed thru capacitors 96 filtering the power of high frequency radiated and conducted emission noise. The backplane ends of the feed-thru capacitors 96 are connected to daughter board connectors 86 that protrude through the backplane end of the housing 90. The daughter board connectors 86 are adapted to mate, at their backplane ends, with backplane connectors 64 installed in the backplane 60.

Figure 11:
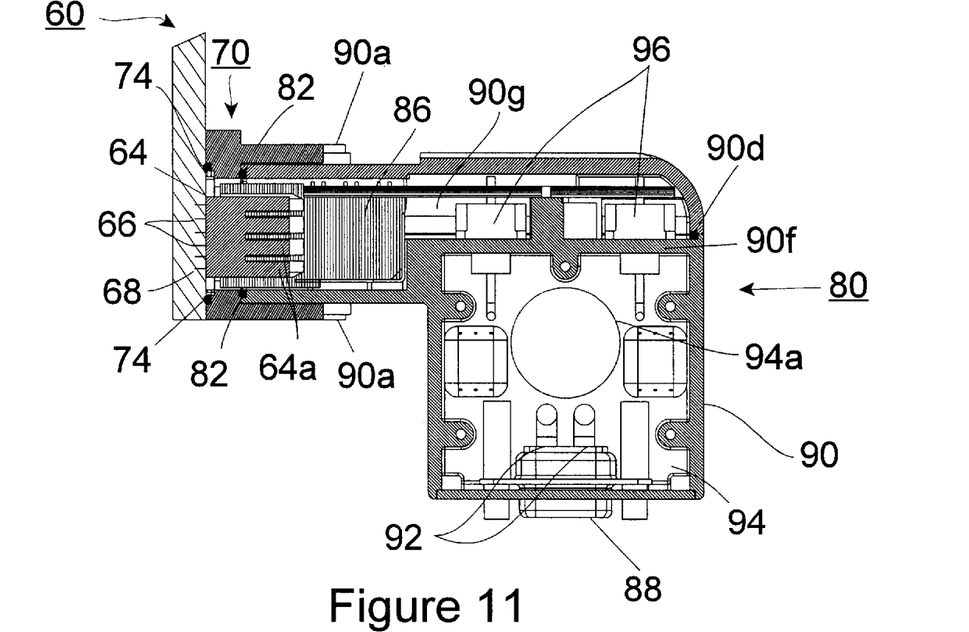
FIG. 11 is a cross-sectional view of the power filter module.

As shown in FIG. 11, the feed-thru capacitors 96 filter the power of high frequency noise as it passes through an internal wall 90f of the aluminum housing 90 into a faraday cage 90g. Current enters the faraday cage 90g through the feed-thru capacitors 96 whose opposite ends are terminated in the small printed circuit board 94. The feed-thru capacitors 96 carry the current to the high current daughter board connector 86 which pass the current into the backplane 60 through the mated backplane connectors 64 installed in the backplane 60.

The faraday cage 90g is created by the aluminum housing 90 of the power filter module 80 which enclosed the backplane connectors 64 and the surface layer metal, typically copper, of the backplane 60. An electromagnetic seal between the aluminum housing 90 of the power filter module 80 and the backplane 60 is provided by the elastomeric gasket 82 which is compressed between the aluminum housing 90 and the power input mount 70. When the power filter module is properly mounted a press fit is provided, thereby producing a conductive seal. The power filter module is held captive by fasteners 84 located on the backplane end of the power filter module housing 90 that are mated to corresponding mounting holes 76 located on the power input mount 70.

Figure 12:
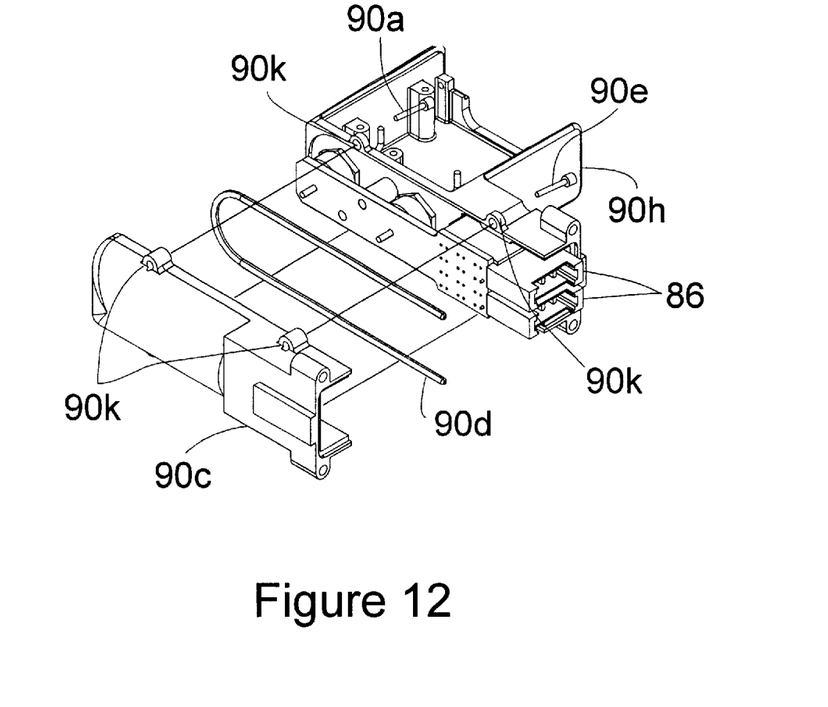
FIG. 12 is an assembly perspective view of the power filter module components' assembly and relation to each other.
Figure 13:
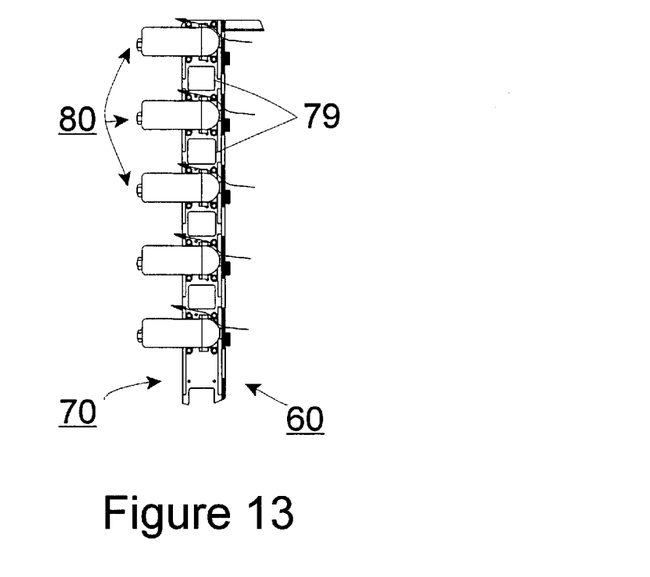
FIG. 13 is an assembly perspective view of the power filter module components' assembly and relation to each other.
Figure 14:
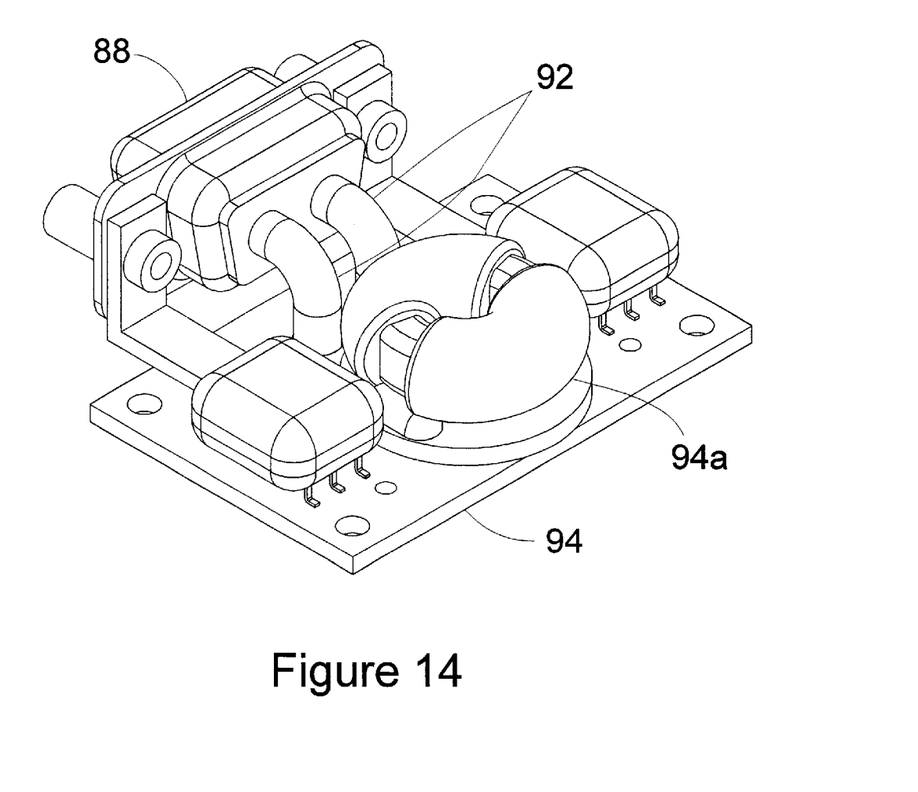
FIG. 14 is an assembly perspective view of the power filter module components' assembly and relation to each other.

As shown in FIGS. 12, 13, and 14, the aluminum housing 90 of the power filter module 80 is manufactured in three sections, a faraday cage housing section 90c, a power input housing main body section 90h, and a power input housing top plate section 90i. The housing 90 is assembled in these three sections so as to facilitate the assembly of the internal components of the power filter module 80, including the feed-thru capacitors 96, printed circuit board 94, daughter board connectors 86, D-Subminiature connector 88, and the high current pins 92. The faraday cage housing section 90e and the power input housing main body section 90h are electromagnetically sealed to each other using another elastomeric gasket 90d which is compressed between the two main housing sections 90c and 90h using fasteners 90e which couple corresponding fastener eyelets located on the top and bottom of the housing sections 90c and 90h so as to provide a press fit, thereby producing a conductive seal. The power input housing top plate section 90i is then fastened to fastening posts 90m incorporated into the power input housing main body section 90h to complete the power filter module 80 assembly.

The feed-thru capacitors 96 filter high current power, up to 30A, of electromagnetic interference. The capacitors 96 provide up to 60 dB of filtering effectiveness up to 1 GHz, with moderate performance, greater than 20 dB, up to 10 GHz, An advantage of the preferred embodiment is that power input granularity is greatly increased since the power filter module 80 is so small, providing room to have a one to one power input to circuit pack ratio on the backplane 60, eliminating the need for separate A and B sources of power. It is preferably to use valuable board real estate for signal connection is rather than landing redundant sources of power on the backplane 60. In non-redundant power input solutions when one power input module services many different circuit packs then all those circuit packs would lose power if the power input module was to go out of service. The preferred embodiment power filter module 80 is so small that there is room to have a single power filter module 80 per circuit pack so that multiple packs will not go down if one power filter module 80 requires servicing.

In the preferred embodiment the small size of the power filter modules 80 enables all the power to enter the backplane 60 in a small column along the side of the backplane 60 making maintenance access convenient.

Another advantage of the preferred embodiment is that in creating an extruded H shaped metallic rail that can be mounted with an GMC seal to the backplane 60, the rail can now provide a mounting surface for mounting the power filter modules 80. Multiple power input unit connectors need no longer be installed in a backplane. Tapping holes in an extruded metal rail for mounting the power filter modules 80 is much cheaper than assembling many self-clinching fasteners into a backplane.

As well, power filter modules 80 need guidance and that has traditionally required the installation of a multitude of guide pins in a backplane which, in totality, take up a lot of valuable backplane real estate. In the preferred embodiment the power filter modules 80 are guided into position using the vertical walls of the H shaped extrusion, eliminating the need for any guidance pin holes in the backplane 60. Slots 78 cut into the sides of the H shaped rail act like card guide slots, guiding the power filter modules 80 into place. This allows for wider power tracks, thereby providing for increased current capacity on the backplane 60.

Another advantage of the preferred embodiment is higher power and signal connection density. One power filter module 80 could supply 1080 Watts at 36 v or 2160 watts at 72 V (without margin and assuming a maximum 30A current). The power filter modules 80 are compact, maximizing power density. In this manner a large amount of power can be landed on the backplane 60 while taking minimal backplane footprint area allowing for more signal connections. An increase of signal connections of up to 33% was achieved in testing.

In the preferred embodiment installation is easy and the power filter modules 60 are field replaceable. As shown in FIG. 9, the power filter modules 80 are mounted to the power input mount 70 without a power cable 97 being attached. The cables 97 can be attached after shipping, providing for easy installation. The power filter modules 80 are mounted to the power input mount 70 while at the same time being in electrical contact with the backplane 60 through backplane connectors 64 which mate and unmate easily with the daughter board connector 85 of the power filter modules 80, enabling the power filter modules 80 to be field replaceable.

Figure 15:
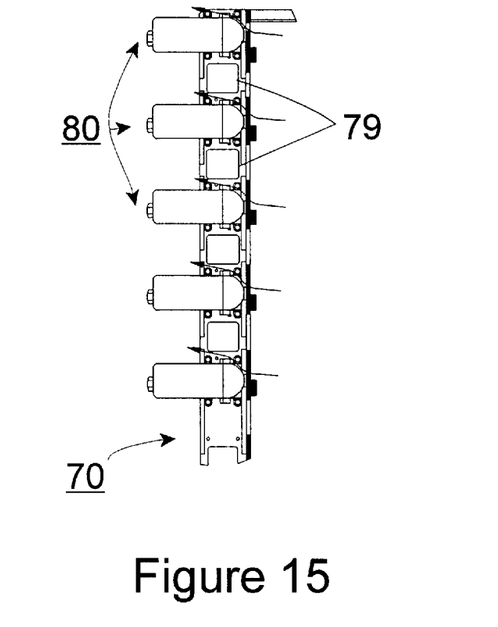
FIG. 15 is an elevation view of the flow of air in a forced air solution.

The large power input modules of typical power landing solutions block much more air flow in forced air solutions. Another advantage of the preferred embodiment is that airflow impedance is minimized in forced air solutions. As shown in FIG. 15, the power filter module's 80 aluminum housing 90 is curved like an air foil or cowling to minimize head loss in airflow paths.

As shown in FIG. 9, in one embodiment of the invention, one or more filters 94a may be incorporated on the printed circuit board 94 to filter the power of lower frequency noise.

Figure 16:
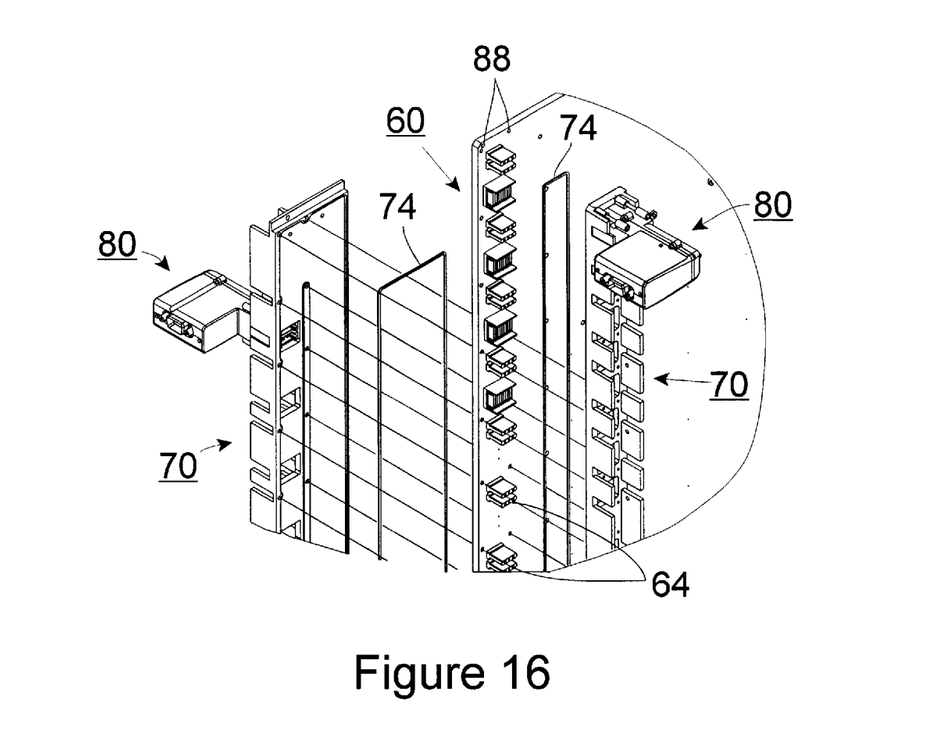
FIG. 16 is an assembly perspective view of two power input mounts sandwiching a midplane.

As shown in FIG. 16, in another embodiment of the invention, a midplane 69 is sandwiched by two power input mounts 70. In this way power can be landed in a high density manner on the double-sided midplane 69. In this midplane 69 embodiment, the opposing backplane connectors 64 have their sets of copper pins 66 offset from one another to avoid electrical contact.

In another embodiment of the invention, the H shaped extruded metal rail of the power input mount 70 can also act as a structural member for a shelf that mounts to the backplane 60.

What is claimed is:

1. A backplane power landing system comprising:

(i) a backplane;

(ii) at least one power input mount comprising a rail of conductive material connected to the backplane so as to be conductively sealed for the purpose of electromagnetic compatibility;

(iii) at least one power input module; and (iv) a means for connecting the power input module to the power input mount that provides for a conductively sealed contact between the power input module and the backplane whereby power flows in an electromagnetically compatible manner between the power input module and the backplane.

2. The system according to claim 1, wherein the means for connecting the power input module to the power input mount comprises:
   (i) at least one connector on the power input module for mating with corresponding holes in the power input mount so as to link the power input module with the power input mount; and
   (ii) the backplane end of the power input module protruding through an opening in the module so as to mate with the backplane to enable power to flow in an electromagnetically compatible manner between the power input module and the backplane.

3. The system according to claim 2, further comprising at least one copper pin electrically connected at one end to the backplate end of the backplane connector, and at the other end inserted into a copper-lined pin hole that runs transversely through the interleaved layers of the backplane to enable power to flow in an electromagnetically compatible manner between the power input module and the backplane.

4. The system according to claim 1, wherein the power input mount is connected to an edge of the backplane.

5. The system according to claim 4, wherein the edge of the backplane is extended to facilitate connecting the power input mount.

6. The system according to claim 1, wherein the power input module comprises a filter thereby forming a power filter module for filtering the power of radiated and conducted emission noise.

7. The system according to claim 1, wherein the power input mount is substantially U shaped and has alignment features adapted to receive corresponding alignment features on the power input modules to facilitate alignment when connecting the power input modules to the power input mount.

8. The system according to claim 7, wherein the power input mount alignment features are slots.

9. The system according to claim 1, wherein the power input module has alignment features adapted to mate with the alignment features in the power input mount to facilitate alignment when connecting the power input modules to the power input mount.

10. The system according to claim 9, wherein the power input module alignment features are protrusions.

11. The system according to claim 1, further including a midplane and two of the rails oriented back to back so as to sandwich an edge portion of the midplane to enable mounting of a plurality of power input modules on both sides of the midplane.

12. The system according to claim 1, wherein the conductive material comprises extruded metal.

13. The system according to claim 1, wherein the rail provides structural support.

14. The system according to claim 1, wherein the means for connecting the power input module to the power input mount comprises at least one elastomeric gasket providing the conductively sealed contact between the power input module and the backplane.

15. The system according to claim 6, wherein the power filter module comprises:
   (i) a housing;
   (ii) at least one power connector integrated into the housing for inputting power; and
   (iii) a conductively sealed means for enabling the filtered power to flow in an electromagnetically compatible manner from the filter to the backplane.

16. The system according to claim 15, wherein the housing is comprised of aluminum to provided electromagnetic shielding.

17. The system according to claim 15, wherein the housing comprises a plurality of sections to provide ease of assembly of the power filter module elements, the housing comprising:
   (i) a power input housing section comprising:
      (a) a main body section; and
      (b) a top plate section fastened to the top of the main body section;
   (ii) a faraday cage housing section mated with the power input housing section; and
   (iii) an elastomeric gasket located between the power input housing section and the faraday cage housing section so as to provide a conductive seal.

18. The system according to claim 15, wherein the power filter module comprises:
   (i) at least two high current pins on the power connector;
   (ii) at least one printed circuit board connected to the high current pins;
   (iii) at least one feed-thru capacitor terminated in the printed circuit board, the capacitor filtering the power of high frequency radiated and conducted emission noise; and
   (iv) a conductively sealed means for enabling the filtered power to flow in an electromagnetically compatible manner from the feed-thru capacitor to the backplane.

19. The system according to claim 15, wherein the power filter module housing profile minimizes head loss in airflow paths of forced air solutions.

20. The system according to claim 18, wherein the printed circuit board has at least one filter for low frequency noise.

21. The system according to claim 18, wherein the conductively sealed means comprises:
   (i) at least one daughter board connector attached to the backplane end of the feed-thru capacitor;
   (ii) at least one installed backplane connector connected to the backplane end of the daughter board connector; and
   (iii) a means for enabling power to flow in an electromagnetically compatible manner between the capacitor and the backplane.

22. The system according to claim 21, wherein the power flow enabling means comprises at least one copper pin electrically connected at one end to the backplane end of the backplane connector, and at the other end inserted into a copper-lined pin hole that runs transversely through the interleaved layers of the backplane to enable power to flow in an electromagnetically compatible manner between the power input module and the backplane.

23. A backplane power landing system comprising:
   (i) at least one power filter module connected to a backplane, the power filter module comprising:
      (a) a housing;
      (b) at least one power connector integrated into the housing for inputting power;
      (c) at least one filter connected to the power connector for filtering the power of radiated and conducted emission noise; and
      (d) at least one power filter module connector connected to the backplane end of the filter;
   (ii) a means for maintaining a conductive seal between the filter and the backplane;
   (iii) at least one installed backplane connector mated with the backplane end of the power filter module connector; and (iv) a means for enabling power to flow in an electromagnetically compatible manner between the power filter module and the backplane.

24. The system according to claim 23, wherein the power flow enabling means comprises at least one copper pin electrically connected at one end to the backplane end of the backplane connector, and at the other end inserted into a copper-lined pin hole that runs transversely through the interleaved layers of the backplane to enable power to flow in an electromagnetically compatible manner between the power input module and the backplane.

25. The system according to claim 23, wherein at least one edge of the backplane is extended to facilitate connecting the power filter modules.

26. The system according to claim 23, wherein the conductive seal means comprises at least one elastomeric gasket.

27. The system according to claim 23, wherein the housing is comprised of aluminum to provide electromagnetic shielding.

28. The system according to claim 23, wherein the housing comprises a plurality of sections to provide ease of assembly of the power filter module elements, the housing comprising:
 (i) a power input housing section comprising:
  (a) a main body section; and
  (b) a top plate section fastened to the top of the main body section;
 (ii) a faraday cage housing section mated with the power input housing section; and
 (iii) an elastomeric gasket located between the power input housing section and the faraday cage housing section so as to provide a conductive seal.

29. The system according to claim 23, wherein the housing profile minimizes head loss in airflow paths of forced air solutions.

30. The system according to claim 23, wherein the power filter module comprises
 (i) at least two high current pins on the power connector;
 (ii) at least one printed circuit board connected to the high current pins;
 (iii) at least one feed-thru capacitor terminated in the printed circuit board, the capacitor filtering the power of high frequency radiated and conducted emission noise; and
 (iv) at least one daughter board connector attached to the backplane end of the feed-thru capacitor for mating with an installed backplane connector.

31. The system according to claim 30, wherein the printed circuit board has at least one filter for low frequency noise.

32. A backplane power landing system comprising a power input mount for a backplane comprised of a rail of conductive material adapted to be connected to an edge of the backplane so as to be conductively sealed therewith, the mount being substantially U shaped to provide a central portion for connection to the backplane and spaced arms with guidance features to receive mating features on a power input module, the mount having holes to receive power input module connectors so as to link the power input module with the power input mount, the power input module protruding through an opening in the mount so as to mate with the backplane and having a means for enabling power to flow in an electromagnetically compatible manner between the power input module and the backplane.

33. The system according to claim 32, wherein the power flow enabling means comprises at least one copper pin electrically connected at one end to the backplane end of the backplane connector, and at the other end inserted into a copper-lined pin hole that runs transversely through the interleaved layers of the backplane to enable power to flow in an electromagnetically compatible manner between the power input module and the backplane.

34. The system according to claim 32, wherein the conductive seal comprises at least one elastomeric gasket.

35. The system according to claim 32, wherein the rail is substantially H shaped and adapted to be connected to a backplane so as to sandwich the at least one elastomeric gasket, compressing the at least one gasket between the power input mount and the backplane whereby a conductive seal is provided.

36. The system according to claim 32, wherein the rail is comprised of extruded metal.

37. The system according to claim 32, wherein the rail provides structural support.

38. The system according to claim 32, wherein at least one edge of the backplane is extended to facilitate connecting the power input mounts.

* * * * *